United States Patent
Kamakura et al.

(10) Patent No.: US 7,564,253 B2
(45) Date of Patent: Jul. 21, 2009

(54) TEMPERATURE CHARACTERISTIC INSPECTION DEVICE

(75) Inventors: Mitsutoshi Kamakura, Osaka (JP); Kouichi Andou, Osaka (JP); Yasunori Mititsuji, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 407 days.

(21) Appl. No.: 11/637,504

(22) Filed: Dec. 11, 2006

(65) Prior Publication Data

US 2007/0132470 A1    Jun. 14, 2007

(30) Foreign Application Priority Data

Dec. 12, 2005   (JP) .............................. 2005-357072

(51) Int. Cl.
*G01R 31/28* (2006.01)

(52) U.S. Cl. ....................... 324/760; 324/765

(58) Field of Classification Search ................ 324/760, 324/765, 767, 158.1; 165/80.2–80.4, 104.33; 361/688–723; 454/184
See application file for complete search history.

(56) References Cited

U.S. PATENT DOCUMENTS

| 5,220,277 | A | * | 6/1993 | Reitinger | 324/754 |
| 6,032,724 | A | * | 3/2000 | Hatta | 165/80.2 |
| 6,184,676 | B1 | * | 2/2001 | Baker et al. | 324/158.1 |

FOREIGN PATENT DOCUMENTS

| JP | 10-289934 | 10/1998 |
| JP | 10-321683 | 12/1998 |

\* cited by examiner

*Primary Examiner*—Ernest F Karlsen
(74) *Attorney, Agent, or Firm*—Fish & Richardson P.C.

(57) ABSTRACT

Optoelectronic properties of optical communication LEDs, LDs and PDs should be examined in a wide range of temperatures between −40° C. and +85° C. Low temperature photocharacteristics of as-chip devices are tested by preparing an inspection stage cooled at a low temperature encapsulated in a shield casing with a front opening, conveying a chip of LD, LED or PD by a collet via the opening, placing the chip on the cold stage, blowing the stage and chip with cool dry air for preventing the chip from wetting, touching the chip by a probe, applying a current/voltage to the chip, examining emission/detection of the chip and taking the chip off via the opening by the collet.

11 Claims, 5 Drawing Sheets

EMBODIMENT 2

TEMPERATURE CHARACTERISTIC INSPECTION DEVICE

RELATED APPLICATIONS

This application claims priority to Japanese Patent Application No. 2005-357072 filed Dec. 12, 2005.

BRIEF DESCRIPTION OF THE INVENTION

This invention relates to a low-temperature characteristic inspection device which is capable of examining operation characteristics of optoelectronic semiconductor devices at an as-chip step at low temperatures. Normal operation is required of semiconductor devices in a wide temperature range from −40° C. to +85° C. Guarantee of good operation in the wide range of temperatures should be a requisite for optoelectronic devices, e.g., light emitting devices and light detecting devices and logical electronic devices as FETs. Light emitting devices mean laser diodes (LDs) and light emitting diodes (LEDs). Light detecting (receiving) devices denote photodiodes (PDs), phototransistors (PTRs) and avalanche photodiodes (APDs). Temperature-dependent characteristics of semiconductor devices should be examined between −40° C. and +85° C. However, it is time-consuming to examine the characteristics for all temperatures between −40° C. and +85° C. Thus in ordinary cases, operation characteristics of semiconductor devices are examined at three selected temperatures, e.g., at +85° C., +25° C. and −40° C. In the description, optoelectronic devices (light emitting devices LD, LED and light receiving devices PD, PTR and APD) are often called "photodevices" in brief. Namely "photodevice" is a collective concept including both light emitting devices (LD and LED), and light receiving devices (PD, PTR and APD). Light emission and light detecting characteristics of optoelectronic devices are called "photocharacteristics" in short. Namely "photocharacteristics" are collective concepts including both light emitting properties of LDs and LEDs and light receiving properties of PDs, PTRs and APDs. The optoelectronic devices relate, in particular to LDs and PDs included in optical communication systems. Inspection at a low temperature, e.g., −40° C. causes a very difficult problem. The atmosphere contains much water vapor. The air in the atmosphere has a high dew point (temperature), at which the air begins water condensation and makes dew. If an object were cooled to a temperature as low as −40° C. in the atmosphere, water vapor would be condensed into dew on the object. The object is wetted with dew. The examination of the object would be impossible due to wetting. Water would debase the object. In actual cases, photocharacteristics at still lower temperatures between −42° C. and −45° C. should sometimes be examined. Water-condensation forbids such a low temperature photocharacteristic inspection in the atmosphere.

Semiconductor devices are made on a substrate wafer. A processed wafer has plenty of device units (thousands to tens of thousands). This is called a wafer step. The processed wafer is cut into many device chips. This is called a chip step. The chip is encapsulated into a package, wired to lead pins and hermetic-sealed. This is a packaged step. The packaged one is a complete device. Three phases should be discerned in processes of fabricating photodevices. A complete packaged device has a vacuum or dry inert-gas filled inner space. Cooling causes no water-condensation on the chip in the hermetic-sealed package. Current inspection methods are applicable only to complete devices with the vacuum or inert-gas sealed package. A driving current can be supplied via leadpins. The current inspection apparatus examines complete, packaged devices. Examining photocharacteristics of the packaged devices, the apparatus discriminates between good ones and bad ones. The packaged devices which have been judged as bad ones are abandoned. The ratio of the number of good ones to the total number is called a "yield". A low yield causes a serious problem.

BACKGROUND OF THE INVENTION

Current inspection apparatus examine complete packaged devices. If many defective devices were found (poor yield case), many complete devices should be abandoned. Not only chips but also stems, caps, wirings and other elements which accompany packages shall be wasted. Labor of packaging and wirings shall be lost. Inspection in a state of wafers or a state of chips would be far favorable than the current inspection in a final state of complete, packaged devices for avoiding such a big loss. An as-wafer examination would be preferable to an as-chip examination from the standpoints of reducing time and cost. But the as-wafer examination is forbidden for optoelectronic devices which cause light/electricity conversion. Difficulty of treatment of light inhibits the as-wafer examination. In the case of light emitting devices of LEDs and LDs, the emission property is examined by supplying a current to an object device for producing light and detecting the light. In the case of light receiving (detecting) devices of PDs and APDs, the detection property is examined by irradiating an object device with a test beam which has been prepared by an outer light source and measuring a photocurrent induced by the light. Thus optoelectronic devices (photodevices) cannot be examined in the state of a wafer. The as-wafer examination is impossible for photodevices. Furthermore the inspection in the state of a chip is also inapplicable to photodevices. Then the as-wafer examination and the as-chip examination have been inapplicable to photodevices.

Current inspection methods examine emission/detection properties of completed devices which have stored and sealed chips in packages in a thermostat by changing surrounding temperatures from −40° C. to +85° C. As-package inspection is prevalent in photodevices at present. Problems accompany the as-package inspection. When a device is judged as a bad one, the device is abandoned as a whole. Packages and labor and time of packaging (welding, wiring) are wasted. Occurrence of big loss is undesirable. These are drawbacks of the current as-package inspection.

It would be the most favorable to judge whether chips are good or bad before being packaged to complete devices. It is named as-chip inspection here. It would alleviate package cost and packaging labor cost. At present no as-chip inspection method has been contrived. High temperature or room temperature characteristics would be able to be examined in a state of chips even at present by placing a chip on a stage kept at a high temperature (+85° C.) or room temperature (+25° C.), supplying a current/voltage to the chip and measuring emission/detection properties of the chip.

However, the as-chip inspection is impossible to apply to the low temperature inspection because low temperatures induce water vapor included in the atmospheric air to condense into water at a temperature as low as −40° C. Condensed water wets the chip, stage, probe and other elements. The examination is impossible. The chip is debased. Thus no as-chip examination is available for low temperatures at present.

Japanese Patent Laying Open No. 10-289934 proposed a probing apparatus and a probing method for examining low temperature characteristics of device units processed on a wide silicon wafer unit by unit by protecting the processed wafer from water condensation. The proposed probing apparatus includes a stage movable in X-, Y- and Z-directions, a probe for testing units, a probe chamber having the stage and the probe, a conveying apparatus with an arm, a loader chamber having the conveying apparatus and a partition wall having a hole and furnished between the probe chamber and the loader chamber. The apparatus tests device units made on a silicon wafer by holding the fabricated wafer on an arm of the conveying apparatus, extending the arm via the hole, placing the wafer on a stage of the probe chamber, pulling the arm back to the loader chamber, cooling the wafer/stage to −60° C., lifting the cooled stage/wafer, bringing the wafer into contact with a plurality of probes, supplying dry air having a dew point of −70° C., allotting currents to all the units via the probes and examining electronic properties of all the units at a stretch.

The arm of the conveying apparatus carries the examined cold wafer to the loader chamber. In the loader chamber the wafer is warmed by blowing hot air with a temperature of 80° C. The hot wafer is immune from being contaminated with water or particles. A contrivance is to heat the examined cool wafer by hot air in the loader chamber for avoiding contamination. The apparatus can examine plenty of electronic device (not photodevice) units fabricated upon a 12 inch (300 mm) diameter silicon (Si) wafer by many probes at a stretch. The apparatus has a big loader chamber and a wide probe chamber since the wide stage rises and sinks, and the conveying apparatus carries the large wafer by long arms. An inner space of the probe chamber is quite wide. The wide inner space requires a huge consumption of dry air.

This is a large-sized apparatus for judging whether electronic properties of plenty of electronic device units are good or bad by many probes at a stroke. However, the apparatus can measure only electronic properties which are detected by probes. Objects are transistors, field effect transistors (FETs), large scaled integration circuits (LSIs) and other exclusively-electronic devices. The apparatus cannot examine LEDs, LDs or PDs which require emission/detection measurements. Japanese Patent Laying Open No. 10-289934 is entirely inapplicable to low temperature photocharacteristic examination of photodevices. This is explained here due to the description of a low temperature examination.

Japanese Patent Laying Open No. 10-321683 proposed a probing apparatus and a method for examining electric properties of device units produced on a 300 mm diameter silicon wafer in a manner similar to the aforementioned Japanese Patent Laying Open No. 10-289934. The apparatus includes a probe chamber, a loader chamber and a conveying apparatus. Horizontally expanding/shrinking arms of the conveying apparatus carry a wafer between the probe chamber and the loader chamber. The stage (main chuck) in the probe chamber can cool the wafer down to a predetermined low temperature. The stage can ascend and descend. Receiving a wafer from the arm, the stage rises and brings device units of the wafer into contact with a plurality of probes furnished on an upper wall of the probe chamber. Japanese Patent Laying Open No. 10-321683 points out a serious problem. When the wafer is lifted up into contact with the probes, a space between the wafer and the probe chamber wall is so narrow that dry air cannot sufficiently pervade the nearly closed wafer/probe space. Insufficient supply of dry air fails to replace residual air in the probe/wafer space completely by dry air. The residual air is condensed to water by cooling. The water wets the wafer and the probes. This is the matter of Japanese Patent Laying Open No. 10-321683.

Japanese Patent Laying Open No. 10-321683 suggested a contrivance of introducing dry air into the probe/wafer space by piercing the space with a dry-air supplying pipe. Japanese Patent Laying Open No. 10-321683 also examines electronic properties of electronic devices in a state of a wafer. This tests electronic characteristics of devices fabricated on a 300 mm diameter silicon wafer. Japanese Patent Laying Open No. 10-321683 is inapplicable to photodevices. Japanese Patent Laying Open No. 10-321683 is entirely incompetent for the examination of LEDs, LDs, PDs and APDs. This is described here owing to the description of use of dry air.

Examination of light emitting devices, e.g., light emitting diodes (LEDs) and laser diodes (LDs) and light detection devices, e.g., photodiodes (PDs) and avalanche photodiodes (APDs) requires actual light production or light reception. Necessity of light exchange prevents people from examining light emitting or receiving devices in a state of as-wafer devices. The techniques proposed by Japanese Patent Laying Open No. 10-289934 and Japanese Patent Laying Open No. 10-321683 are inapplicable to the inspection of light emitting-/receiving devices. A fabricated wafer is cut into plenty of small units of devices by scribing and separating. A small unit is called a device "chip". Furthermore current photodevice examining methods are inapplicable even to as-chip devices.

Current inspection methods for photodevices can examine neither as-chip devices nor as-wafer devices. At present, no photodevice inspection method can examine photodevices in a state as a chip. The current inspection methods can examine completely fabricated light emitting/detecting devices encapsulated into packages and equipped with lead pins. In the case of light emitting devices (LED and LD), the photocharacteristics are examined by carrying a packaged LED or LD onto a test socket, inserting lead pins into holes of the stage, supplying a driving current via the lead pins of the package, making the device to emit light via an upper window of the package and measuring the power and spectrum of via-window emitted light. In the case of light receiving devices (PD, APD and PTR), the photocharacteristics are examined by carrying a packaged PD, APD or PTR onto a test socket, inserting lead pins into holes of the stage, applying a reverse bias voltage via the lead pins of the package, irradiating the device by a test beam and measuring a photocurrent caused by the test beam. This method is called "as-package" inspection, from which the as-wafer or as-chip inspection is entirely different.

Drawbacks accompany the as-package inspection. When a complete device is judged as a reject, the whole must be abandoned. The package is also a waste.

Packaging task is lost in vain. A package contains leadpins, a disc stem, a lens, a windowed cap and inert gas. Packaging requires adhesion, wiring, alignment, gas-replacement and welding. The as-package inspection invites a great loss. If the yield, which is a ratio of good ones to the whole, is sufficiently high close to 100%, the loss is small. But the yield is not always high for the production of LDs, LEDs and PDs for optical communications.

A more desirable one is an inspection apparatus which would be able to inspect photochacteristics of device chips and would judge whether the chip is good or bad in the stage of a chip before being packaged. When a chip is judged as bad, wastage is only the chip. The pre-package examination can save a package and packaging cost for the inherently bad chip. Such an as-chip examination can reduce the cost caused by defective products to about ⅕ of the current packaged-device examination.

There is no inspection device capable of examining the properties of as-chip LED, LD or PD devices at present. If a chip were cooled down to a temperature as low as −40° C., water-vapor contained in the atmosphere would be condensed into water and the water would wet the chip, the probe pushing the chip and the stage holding the chip. Wetted probe, stage and device would be useless. Thus low-temperature inspection of as-chip devices would fail. An alternative would be the use of a thermostat. It may be probable to fetch a chip into a thermostat, cooling the inner space to a low temperature of e.g., −40° C., applying a current to the chip and measuring light power emitted from the chip. However, the test cycle of storing a chip into a large thermostat, cooling the thermostat, giving the chip a current and measuring photo-properties of the chip would consume a long time. It would raise cost far higher than the current as-package examination. Thus there is no as-chip examination apparatus for photodevices at present.

OBJECTS AND SUMMARY OF THE PRESENT INVENTION

A temperature characteristic inspection device of the present invention examines low temperature characteristics of light emitting devices or light detecting devices in a state of a chip by placing a light emitting device chip or a light detecting device chip on a cooled inspection stage enclosed by a shield casing, bringing a probe into contact with the device chip and measuring optoelectronic characteristics in a state of blowing cooled dry-air to the device chip by chip. A gas ejecting aperture, a gas flowing space and a gas exhausting opening align from upstream to downstream along the streamline of dry-air. The present invention allots the gas flowing space a shape and a section that are similar to the gas ejecting aperture. The present invention gives the gas exhausting hole a section narrower than the gas ejecting aperture. The shielding casing forms a rectangular gas flowing basin. Dry air smoothly flows from the upstream dry-air chamber to the downstream opening without stagnation. The shield casing rectifies the flow of dry air into a stationary laminar flow. The dry air stationary flow causes neither invitation nor whirling of external air at the opening. The larger inlet section (wide rectifying plate) and the smaller outlet section (narrow opening) of the dry air stream prevent dry air from inhaling and whirling outer air by insuring high static pressure at the upstream. The opening, which is a hole perforated at a region from a front to a top of the shield casing, plays a role of an exhaustion outlet of dry air and anther role of an inlet/outlet of carrying chips by the collet. This structure enables the present invention to place photocharacteristic examination devices both in front and at the top of the opening and to examine both light emitting devices and light receiving devices.

Photocharacteristics of a light emitting device are examined by laying the light emitting device chip on the inspection stage encapsulated with the shield casing, blowing cooled dry-air to the chip, bringing a probe in contact with an electrode of the chip, supplying a current via the probe and the stage into the chip, causing the chip to emit light and measuring light power and spectrum of the emitted light by a detecting photodiode and a spectrometer.

Photocharacteristics of a light detecting device are examined by laying the light detecting device chip on the inspection stage encapsulated with the shield casing, blowing cooled dry-air to the chip, bringing a probe in contact with an electrode of the chip, irradiating the chip with a test beam, causing the chip to make a photocurrent flowing via the probe and the stage and measuring the power and response time of the photocurrent.

A light emitting device chip or a light detecting device chip is carried from a tray to an inspection stage by a conveying collet which holds a chip by vacuum-chucking for examination. After the inspection, the collet arrests the chip by vacuum-chucking, pulls the chip up from the stage and carries the chip to another tray. Photodevice chips are tiny and light. An LD chip is, for example, 300 μm×200 μm×100 μm (0.006 mm$^3$). Heat capacity of the chip is very small. Heat capacity is a product of a weight and a specific heat. The conveying collet is at room temperature. The collet lowers into contact with a chip, vacuum-chucks the chip, conveys the chip, places the chip on the cool inspection stage, releases vacuum-chuck of the chip, separates the chip and rises up. The isolated chip is cooled by the cold inspection stage instantly. The chip comes into thermal equilibrium with the cool inspection stage. The temperature of the chip rapidly falls and attains to the temperature of the stage which is kept to be a predetermined low temperature (e.g., −40° C.). Uniform flow of cool dry air surrounds the cool chip. Since cool dry air has poor humidity, the coolness of the cool chip invites no condensation of water. The cool chip and the stage are not wetted. Blowing cool dry air to the stage and chip, the device inspects photocharacteristics of the device chip. The stage and chip are free from dew. The cool dry air maintains the dry stage and chip. The dry chip and stage enable the inspection device to examine the optoelectronic characteristics safely in a short time. An emission examination for an LD chip takes a second or a few seconds. A sensitivity examination of a PD chip takes one second or several seconds. When the examination has finished, the collet, which is at room temperature, falls to an examined chip, vacuum-chucks and lifts the examined chip. No sooner has the chip been separated from the stage than the chip is heated to room temperature by the collet. Poor heat capacity of a chip enables the collet to heat the chip up to room temperature immediately.

The warmed chip is lifted up by the collet out of the shield casing via the opening into the atmosphere at room temperature with room humidity. The chip invites no dew, since the chip is not cool but warm at room temperature. There is no temperature difference between the chip and the atmosphere. The chip is safe from wetting in the atmosphere. The temperature of the chip rapidly reciprocates between the low temperature and room temperature by alternative contacts of the inspection stage and the collet. The contact of the collet quickly warms the chip to room temperature. Hot air is unnecessary to blow and heat the chip. Another feature of the present invention is that the inspection stage for supporting an optical communication light emitting/receiving device is positioned in a downstream of dry air beginning from the dry-air chamber via the dry-air path in the shield casing, and the inspection stage is furnished in the vicinity of the opening perforated on the shield casing for exchanging chips and exhausting dry air. The relation between the stage and the opening endows this device with highly-efficient, swift conveyance and inspection of as-chip devices.

A sufficiently powerful cooling device of the inspection stage enables the inspection device to adopt warm dry air at room temperature or near room temperature. Warm dry air is allowable in the case of a high power cooling device. When the temperature of dry air is high, the load on the cooling device for the stage increases.

Alleviation of the load of the cooling device requires dry air of coolness. Use of cold dry air facilitates to cool the inspection stage. A liquid coolant is introduced in the cooling device for eliminating heat. Heated coolant is exhausted to an external withdrawal tank or an external heat-exchanger. It is preferable to circulate the liquid coolant. It is more favorable to make use of the coolant for cooling dry air. Installation of a liquid-air heat-exchanger allows the coolant to cool the dry air. Heat is exchanged between dry air and the coolant by introducing the coolant into a dry-air chamber. The dry-air chamber acts as a heat-exchanger in the case. The coolant cools both dry air and the inspection stage.

The dry air path is enclosed by the shield casing. Dry air is isolated from the external atmosphere by the shield casing. The shield casing allows dry air to maintain inherent low humidity and temperature independently of the atmosphere. The heat capacity of a chip is very small. What should be cooled by the cooling device in each cycle of examination is only a single chip. The demand of dry air for preventing the chip from wetting is not large. For example, a slow flow of 0.5 m/sec or less than 0.5 m/sec of dry air is sufficient. A suitable range is 0.3 m/sec to 2 m/sec for a dry air velocity. Small consumption of dry air alleviates the inspection cost.

The inspection stage must be cooled by a cooling device. The inspection stage is a small segment for supporting and cooling a small chip. A Peltier element is available for the cooling device of the stage. A Peltier element is a heating/cooling element making use of Peltier effect. Peltier effect produces a temperature difference between two junctions of two different materials by flowing a current in the different materials from one electrode to the other electrode. The electric current carries heat. Heat flow is in proportion to the current. One junction is heated and the other junction is cooled. When the direction of the current is reversed, the relation of the heated/cooled junctions is also reversed. The Peltier effect is additive. The temperature difference can be multiplied by piling Peltier effect layers. A lower temperature surface is assigned to joining the inspection stage. A higher temperature surface should be cooled. A coolant is utilized for cooling the higher temperature surface. The coolant cools the higher temperature surface of the Peltier element. The coolant deprives the higher temperature surface of the carried heat. The coolant is heated by the Peltier element. The warmed coolant shall be exhausted to an external tank or an external heat-exchanger. A set of the Peltier element and the coolant circulation can maintain the temperature of the inspection stage at an arbitrary low temperature.

Otherwise, the inspection stage is placed upon the Peltier element and an object device chip is laid upon the inspection stage. In this case, when the Peltier element is exchanged, the height of the inspection stage should be adjusted at the predetermined height.

When the top and the bottom of the vertically-posturing Peltier element are stuck to the side of the heat-exchange block and the back of the inspection stage, the replacement of the Peltier element does not affect the height of the inspection stage. No adjustment of the height is required. The Peltier element carries heat from the stage end to the exchanger end. The heat conveyed by the Peltier element to the exchanger end must be eliminated. A liquid coolant removes the heat from the heat exchanger block. A coolant inlet tube and a coolant outlet tube installed for ridding of the carried heat can pierce the dry-air chamber and can align in parallel to the dry air flow to the heat-exchanger block. Such a contrivance will alleviate the load of the cooling power of inspection stage and will prevent the coolant tubes from wetting. The shield casing which insulates the dry air from the atmosphere can be lined with a porous material. Lining of the porous material will enhance heat insulation and reduce heat load imposed on the coolant. Discharge holes are optionally bored on the shield casing in a direction vertical to the dry air flow. The discharge holes will protect the outer surface of the shield casing from being wetted by condensed water. The opening can alternatively be separated into two holes, a top opening for allowing the collet to carry chips in or out and a front opening for allowing light to pass. Separation of the opening into two enables the shield casing to raise the heat-insulation efficiency and enhance the condensation-prevention power.

When the opening is separated into the top opening for chip-conveyance and the front opening for light-passage, a sliding cap can be optionally mounted on the shield casing for covering the top opening during the examination and for discovering the top opening during chip-replacement. The sliding cap will further increase the heat insulation effect and the vapor condensation prevention effect. The Peltier element transfers heat from one end to the other end according to the direction of a current. In this case, the Peltier element deprives the inspection stage of heat and gives the heat to the heat-exchange block. The heat-exchange block is heated. What deprives the heat-exchange block of heat is a liquid coolant circulating in the device. The coolant input tube and the coolant output tube are provided for circulating the liquid coolant.

In the concrete, a low temperature characteristic inspection device of the present invention includes an inspection stage for sustaining a chip, a cooling device for cooling the inspection stage, a coolant inlet tube for introducing a coolant into the cooling device, a coolant outlet tube for exhausting the coolant warmed by the cooling device, a dry-air chamber for accommodating dry air and causing heat-exchange between the coolant and dry air, a dry-air rectifying plate for rectifying cool dry air into a laminar flow and supplying the inspection stage with the laminar flow of cool dry air, a shield casing enclosing the inspection stage, the coolant inlet/outlet tubes and the cooling device for forming an inner space for the cool dry air flow, a conveying collet for fetching the chip onto the inspection stage and for taking the examined chip from the inspection stage, a probe for coming in contact with an electrode of the chip and supplying a current or a voltage to the chip and a detecting device for examining photocharacteristics of the chip.

In the case of light emitting devices (LDs and LEDs), a low temperature characteristic inspection device of the present invention includes an inspection stage for sustaining a light emitting device chip, a cooling device for cooling the inspection stage, a coolant inlet tube for introducing a coolant into the cooling device, a coolant outlet tube for exhausting the coolant warmed by the cooling device, a dry-air chamber for accommodating dry air and causing heat-exchange between the coolant and dry air, a dry-air rectifying plate for rectifying cool dry air into a laminar flow and supplying the inspection stage with the laminar flow of cool dry air, a shield casing enclosing the inspection stage, the coolant inlet/outlet tubes and the cooling device for forming an inner space for the cool dry air flow, a conveying collet for fetching the chip onto the inspection stage and for taking the examined chip from the inspection stage, a probe for coming in contact with an electrode of the chip and supplying a driving current to the chip and a detecting device for detecting light emitted from the chip.

In the case of light receiving devices (PDs, PTRs and APDs), a low temperature characteristic inspection device of the present invention includes an inspection stage for sustaining a light receiving device chip, a cooling device for cooling the inspection stage, a coolant inlet tube for introducing a coolant into the cooling device, a coolant outlet tube for exhausting the coolant warmed by the cooling device, a dry-air chamber for accommodating dry air and causing heat-exchange between the coolant and dry air, a dry-air rectifying plate for rectifying cool dry air into a laminar flow and supplying the inspection stage with the laminar flow of cool dry air, a shield casing enclosing the inspection stage, the coolant inlet/outlet tubes and the cooling device for forming an inner space for the cool dry air flow, a conveying collet for fetching the chip onto the inspection stage and for taking the examined chip from the inspection stage, a probe for coming in contact with an electrode of the chip, applying a voltage to the chip and guiding a photocurrent and a light source for irradiating the chip with a testing beam.

Advantages of the present invention are clarified. The present invention inspects low temperature photocharacteristics of photodevice chips in a flow of cool dry air, which has a sufficiently low dew point. Dry air of a low dew point is not condensed into water at the low test temperature, since the dry air contains poor water vapor. The chip and stage are immune from wetting. For example, even a low temperature of −40° C., the present invention succeeds in inspecting the photo-characteristics of chips on a good condition. All the prior methods have been applicable to packaged, complete photodevices. The prior methods have been entirely incompetent to as-chip devices. On the contrary, the present invention can inspect as-chip devices before being packaged. This invention is the first method/apparatus which can continually test temperature-dependent photocharacteristics in a wide rage between −40° C. and +25° C. of photodevices at the chip step by supplying dry air to the chip and stage in succession. The present invention can find defective devices at the chip step before packaging. Bad chips are abandoned. Packages and packaging cost are not wasted. Chip cost is trivially small. The present invention can reduce the loss induced by defective devices down to about ⅕ of the loss caused by the prior packaged device testing.

Furthermore the present invention can shorten the examination time per a device. The conventional testing methods have examined complete, packaged devices by inserting lead-pins of the packaged devices into holes of about 100 sockets on a test board, storing the test board into a thermostat, replacing air in the thermostat by dry air, cooling the thermostat to the predetermined temperature gradually, confirming the thermostat temperature to be stable at the determined low temperature, examining emission or detection operations in the thermostat, heating the thermostat slowly, confirming the temperature to attain to room temperature and taking about 100 packaged devices out of the sockets. The heat capacity of the thermostat is very large. It takes a long time to heat or cool the whole of the thermostat. One cycle of examination requires two or three hours. The test time per one device is 1.2 to 1.8 minutes in the conventional methods.

Replacing chips on a small stage and protecting the chips from dew in succession, the present invention examines the low temperature photocharacteristics of devices chip by chip. The heat capacity is very small. Heating and cooling of a chip are done in a second or seconds. The examination time per chip is less than 30 seconds including conveying time. The short examination time is another important advantage.

The shield casing forms a rectangle-sectioned inner space, which is called a dry air path. The rectangle space enables dry air to flow uniformly from the upstream dry-air chamber to a downstream opening without stagnation. The shielding casing rectifies the flow of dry air in the inner space-dry air path. External air neither invades the chamber nor perturbs the uniform dry air flow.

A set of a wider gas inlet (upstream) section and a narrower gas outlet (downstream) section can keep a lower flow velocity and a higher static pressure at the upstream. The higher upstream pressure prevents external air from invading and swirling into the shield casing.

In addition, the chip/stage cooling velocity can be accelerated by preparing a contrivance of exchanging heat between the coolant and dry air and precooling dry air.

DESCRIPTION OF PREFERRED EMBODIMENTS

Figure 1:
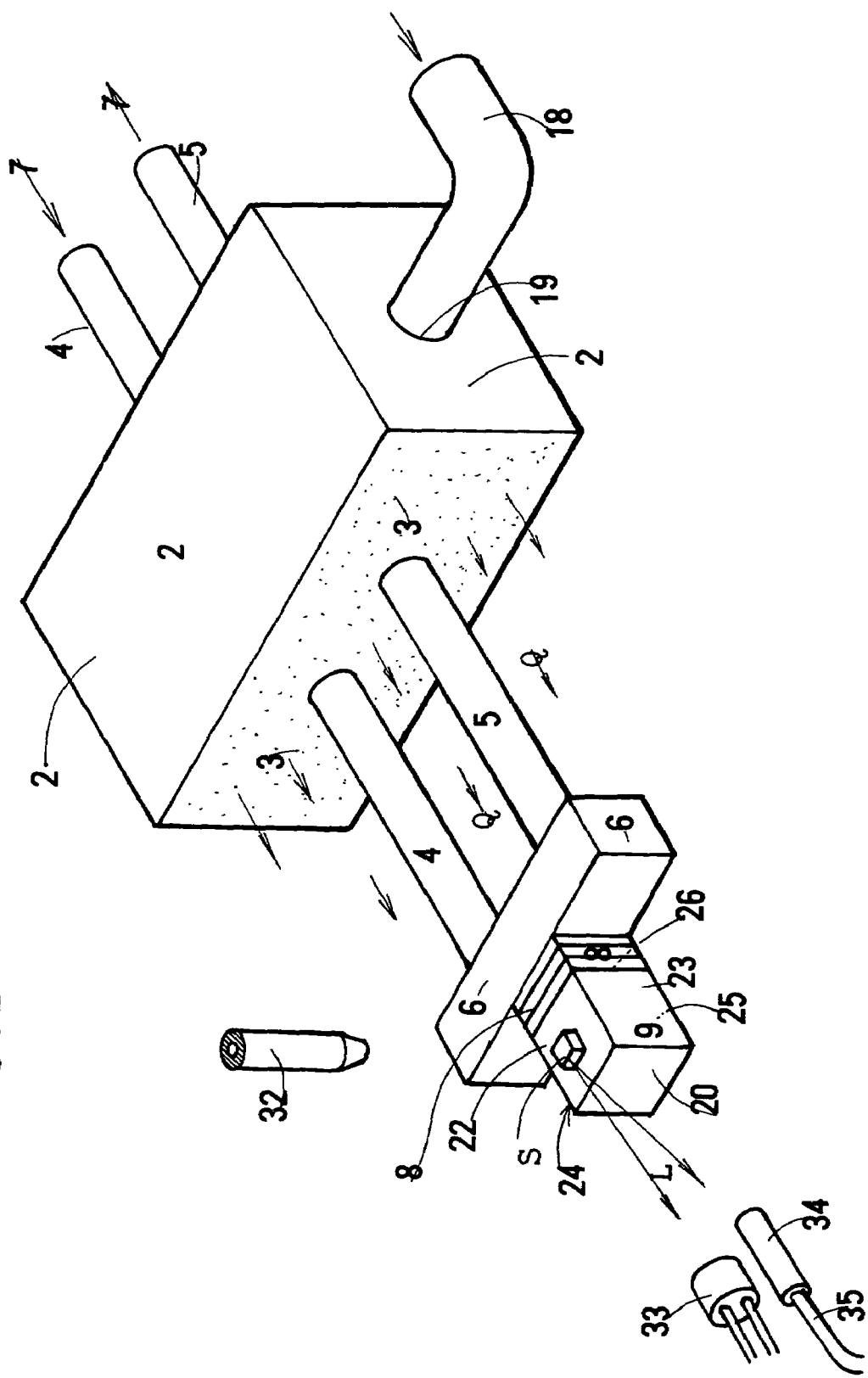
FIG. 1 is a perspective view of a temperature characteristic inspection device of an embodiment of the preset invention in a state of ridding of a shield casing for clarifying an inner structure.

The present invention proposes a temperature characteristic inspection device which has a box-shaped shield casing filled with a cool dry air flow, a cold inspection stage installed in the shield casing, a collet for exchanging chips, a probe for applying a current or voltage and a light analyzer/detector or a test light source. Low temperature photocharacteristics are examined by placing a chip by the collet on the stage via the opening in dry-air filled box-shaped shield casing, pushing the chip by the probe, applying a current/voltage, measuring photocharacteristics and taking the chip via the opening by the collet. The apparatus, which is operative to as-chip devices, is superior to the prior apparatus which are only applicable to packaged final devices. One advantage is to shorten the inspection time. Another advantage is to avoid the loss of packages and packaging cost. The contrivance of protecting chips from water-condensation enables the present invention to inspect as-chip devices.

The box-shaped shield casing has a function of enclosing dry air around the inspecting stage. Dry cool air forbids water condensation. An opening is furnished at an upper front part of the shield casing. The upper opening enables the collet to carry a chip onto the inspection stage and to take the chip from the stage therethrough. Photodevices are continuously inspected chip by chip by exchanging chips via the opening by the collet. The inner space of the shield casing is a dry air path. A uniform dry air flow is prepared by keeping the section of the shield casing to be constant. Since the dry air stream is a laminar, stationary flow in the dry-air path, the dry air does neither inhale nor whirl external wet air. The dry air flow is immune from turbulence. The laminar, stationary air flow stabilizes the temperature of the inspection stage (e.g., at −40° C.). Since the temperature of the inspection stage is stable and constant, the system can examine the chip at the determined temperature as soon as the chip is laid on the stage.

The shape and size of the dry air path in the shield casing should be constant from the upstream to the downstream. The constant shape and size are given by designing the shape of the shield casing as a rectangle or a cylinder. The dry air path has a constant shape and size in the rectangle or cylinder shield casing. The opening is necessary for exchanging chips. The opening has another role of exhausting dry air and allowing testing light to pass. If the opening is separated into a top opening for chip exchange and a front opening for test light passage, the total area can be reduced. Reduction of the area of the opening can alleviate consumption of dry air. Two small openings have an advantage of sparing dry air.

The inspection stage should be cooled by a cooling device. A favorable candidate of the cooling device is a Peltier element. The Peltier element is made by piling a plurality of Peltier effect layers. The inspection stage is fixed on the Peltier element. There are alternatives. If the inspection stage is stuck to a surface of a Peltier element overturned on its side, an exchange of the Peltier element induces no height error to the stage. The horizontal overturning posture of the Peltier element dispenses with readjustment of the height of the inspection stage at replacement of the Peltier element.

If dry air is at room temperature, the contact of the warm dry air with the inspection stage produces a large temperature gradient and causes thermal instability in air. Thus it is desirable to make use of cool dry air by precooling dry air. Preparing cool air is done by guiding dry air into a dry-air chamber which is pierced by coolant circulating tubes and by exchanging heat between the coolant and dry air.

Photocharacteristics of chips are inspected chip by chip in a short cycle time by fetching an unexamined chip by the collet via the opening onto the stage and taking an examined chip from the stage by the collet via the opening. The size of the opening should be determined for allowing the collet to pass up and down. The shape of the opening should be arbitrarily designed. A rectangle, square or round is allowable for the shape of the opening. The allowable minimum opening is a hole capable of permitting the collet to pierce with a small margin.

A dry-air rectifying plate having plenty of small holes is furnished on the front of the dry-air chamber. The dry-air rectifying plate has functions of maintaining a pressure difference between the inside and the outside of the dry-air chamber, equalizing velocities of air flow in the horizontal direction and making uniform air flow distribution in the vertical section of the shield casing. When plenty of microholes are perforated in a normal direction, dry air jets via microholes of the rectifying plate from the dry-air chamber to the inner space of the shield casing. The dry air is rectified by the rectifying plate. The dry air rectifying plate can be a porous plate. A porous dry air rectifying plate is made of porous plastics or porous cermet which is a mixture of ceramic and metal. The present invention succeeds in as-chip inspection for the first time.

Embodiment 1

A Single Opening in Front of the Shield Casing; FIGS. 1-5

Figure 2:
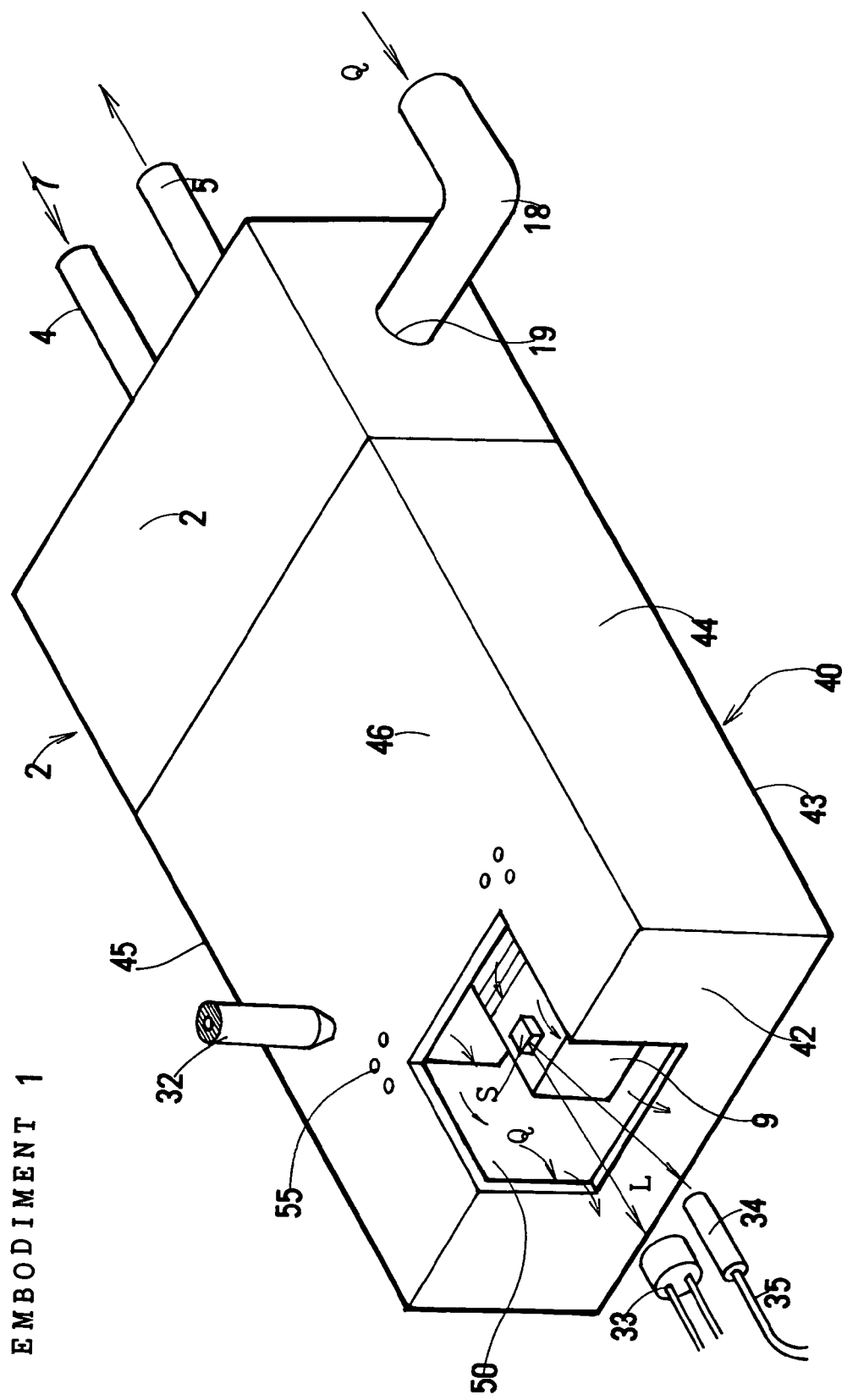
FIG. 2 is a perspective view of the whole of a temperature characteristic inspection device of Embodiment 1 of the present invention in a state of being encapsulated in a shield casing.
Figure 3:
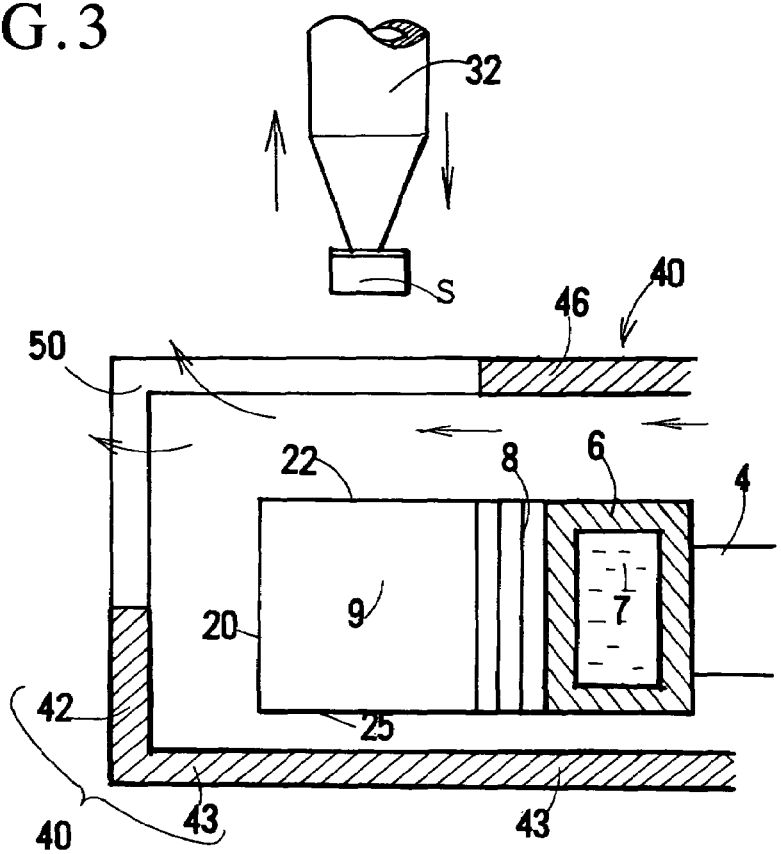
FIG. 3 is a vertically sectioned view of an inspection stage, an opening and a collet of the inspection device for showing a step of vacuum-chucking and carrying an object device chip by a conveying collet onto the inspection stage or another step of chucking and eliminating the device chip from the inspection stage.
Figure 4:
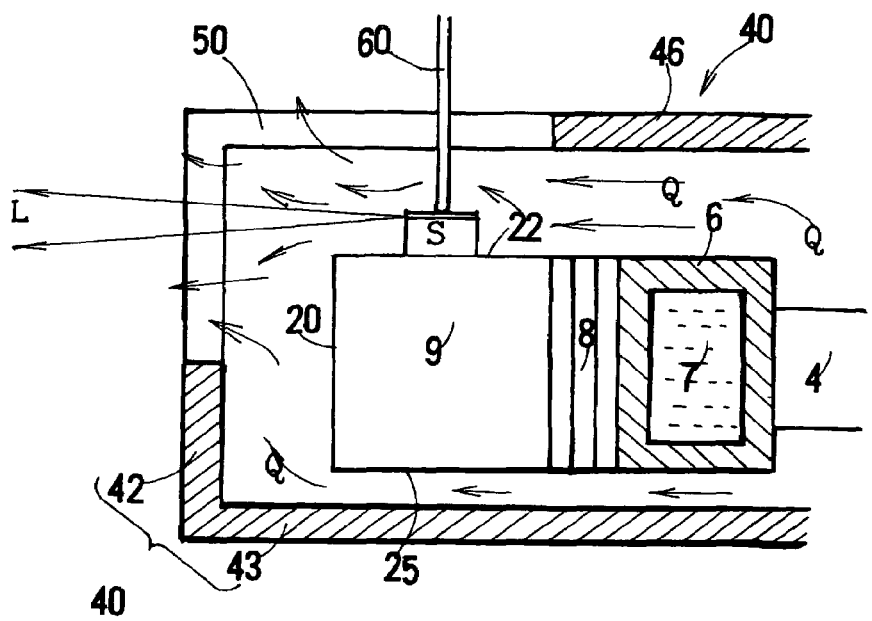
FIG. 4 is a vertically sectioned view of an inspection stage, an opening and a collet of the inspection device for showing a step of laying an object device chip on the inspection stage and pushing the chip by a probe.
Figure 5:
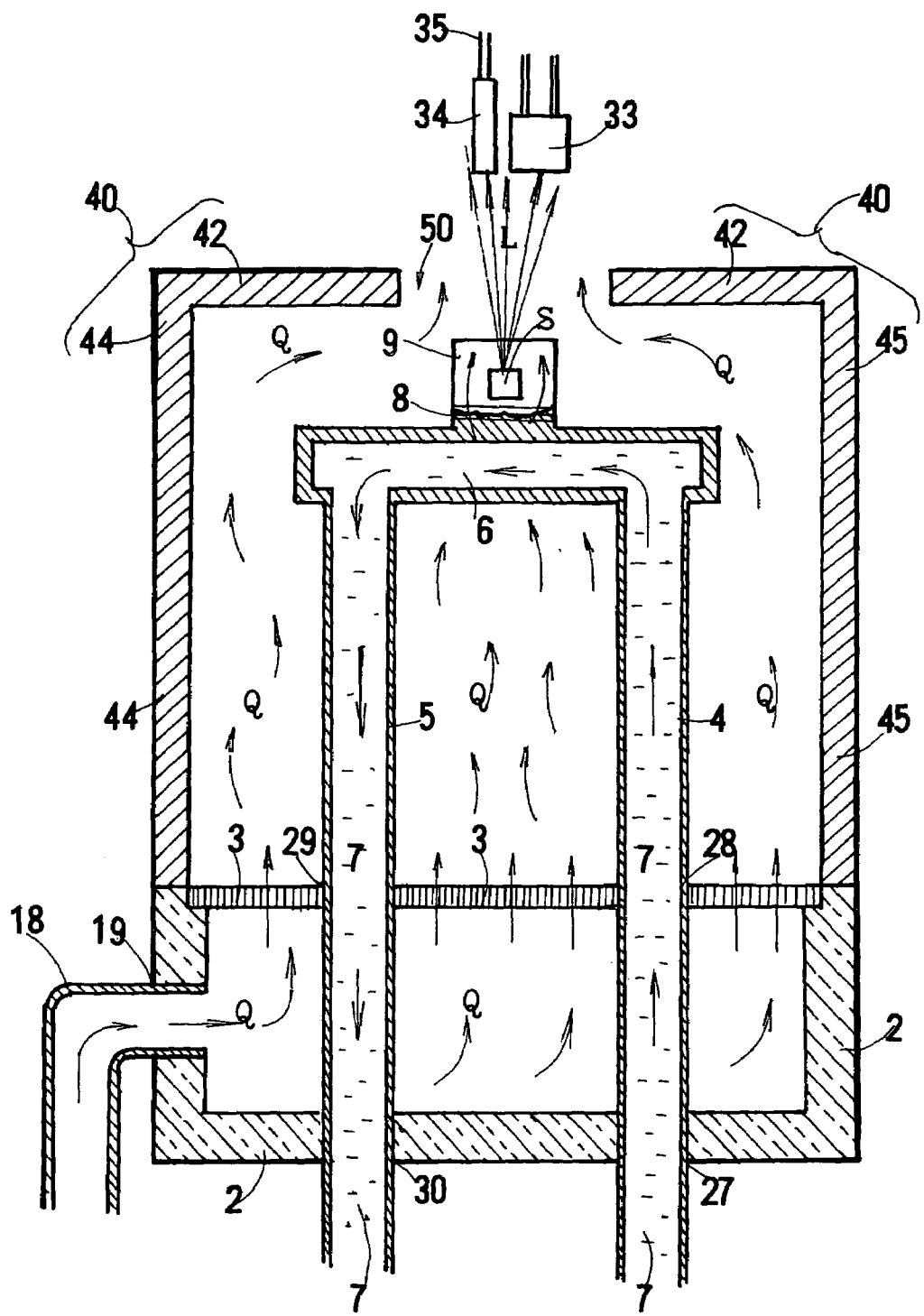
FIG. 5 is a horizontally sectioned view of a temperature characteristic inspection device of Embodiment 1 of the present invention in a state of being encapsulated in a shield casing.

FIG. 1 is a perspective view of a low temperature characteristic inspection device as Embodiment 1 of the present invention in a state of ridding of shield casing. In reality the shield casing encapsulates inner parts. FIG. 1 omits the shield casing for clarifying the inner structure. FIG. 2 is a perspective view of the whole of Embodiment 1 having the shield casing. FIG. 3 is a vertically sectioned view of the forepart of Embodiment 1 for showing a step of fetching an unexamined chip to an inspecting stage via an opening by a collet and a step of removing an examined chip from the inspecting stage via the opening by the collet. FIG. 4 is a vertical sectioned view of the forefront for showing a step of bringing a probe into contact with the chip, supplying a driving current and observing light emitted from the chip via the front opening. FIG. 5 is a horizontally-sectioned view of Embodiment 1 for showing flows of a liquid coolant and dry air.

In FIG. 1, a backward rectangular box is a dry-air chamber 2. The dry-air chamber 2 has roles of accommodating dry air temporarily, enhancing pressure of dry air, exhaling dry air via a front dry-air rectifying plate 3 and making a dry-air uniform stream in a shield casing. The dry-air rectifying plate 3 is, for example, a metal, resin or ceramic plate having plenty of tiny holes for ejecting dry air uniformly from the dry-air chamber 2 into the shield casing. Design of a size, shape and density of the holes should be contingent upon the necessary air quantity, the average air velocity and the pressure loss. Otherwise, the dry-air rectifying plate is a porous plate made from metal, alloy, plastics or ceramic. Adoption of a porous plate can dispense with the manufacturing step of boring many small holes.

A coolant inlet tube 4 and a coolant outlet tube 5 extend in a horizontal direction, piercing the dry-air chamber 2 from rear to front. A heat-exchange block 6 is adapted at front ends of coolant inlet tube 4 and the coolant outlet tube 5. As shown in FIG. 5, a liquid coolant 7 flows from the coolant inlet tube 4, passes in the dry-air chamber 2 for cooling air, reaches the heat-exchange block 6, varies the flowing direction and deprives the heat-exchange block 6 of heat. Warmed coolant liquid 7 changes the flowing direction, flows in the coolant outlet tube 5, cools dry air in the dry-air chamber 2 and is withdrawn in a coolant tank (not shown) or another heat-exchanger. Meandering of the path or inserting of obstacle segments to the path in the heat-exchange block 6 would enhance the heat-exchange rate between the coolant 7 and the block 6 by retarding the flow.

A Peltier element 8 is fitted on a forefront of the heat-exchange block 6. The Peltier element 8 is a pile of a plurality of Peltier effect layers. The pile of plural Peltier effect layers enables the element 6 to raise the temperature difference between fore and rear surfaces. Depiction of wirings of supplying a driving current to the Peltier element 8 is omitted in the figures. Planes of the Peltier layers are vertical. The normals vertical to the Peltier layers direct in a horizontal direction. In the embodiment, there is a reason why the Peltier layers are piled and aligned in the horizontal direction. Thickness errors accompany Peltier effect layers. Piling of a plurality of layers increases thickness errors in proportion to the number of layers. A pile of plural Peltier effect layers often induces an error of ±100 μm in thickness. If a Peltier element were laid upon the block 8 in the vertical direction, the height of chips would fluctuate by ±100 μm, which would cause an error of measuring light power. In the embodiment, the Peltier effect layers are piled in the horizontal direction. No error of chip heights appears in Embodiment 1. The error in the horizontal direction is insignificant.

A rectangle inspecting stage 9 is fitted on the forefront of the Peltier element 8. The inspection stage 9 has a stage forepart 20, a stage top 22, a stage bottom 25, a stage leftside 23, a stage rightside 24 and a stage rear 26. The inspection stage 9 is joined to the Peltier element 8 at the stage rear 26. A device chip will temporarily be laid upon the stage top 22 of the inspection stage 9. The inspection stage 9 is not laid upon the top of the Peltier element 8. The side of the inspection stage 9 is fitted to the side of the heat-exchange block 6 via the Peltier element 8. The inspection stage 9, the Peltier element 8 and the heat-exchange block 6 align in the horizontal direction. If the Peltier element 9 would have an error as large as ±100 μm, the error would induce a horizontal deviation in the forefront of the stage 20, which causes no problem. The height of the top surface 22 of the inspection stage 9 is independent of the thickness of the Peltier element 8. The thickness error of the Peltier element 8 causes no error of the inspection position for photodevice chips.

The coolant inlet tube 4 pierces a coolant inlet tube sustaining hole 27 of the dry-air chamber 2 and a coolant inlet tube sustaining hole 28 of the dry-air rectifying plate 3. The coolant outlet tube 5 pierces a coolant outlet tube sustaining hole 29 of the dry-air rectifying plate 3 and a coolant outlet tube sustaining hole 30 of the dry-air chamber 2. The wall of the dry-air chamber 2 and the dry-air rectifying plate 3 support the coolant inlet tube 4 and the coolant outlet tube 5. The liquid coolant 7 cools dry air in the dry-air chamber 2. Dry air is as cold as the liquid coolant 7. When the dry air reaches the inspection stage 9, the dry air does not warm the inspection stage 9. Low temperature characteristics of semiconductor devices are usually measured at about −40° C. The inspection stage 9 is cooled to a low temperature of −40° C. The Peltier element 8 cools the inspection stage 9 down to −40° C. by depriving heat from the stage and maintains the stage at −40° C. The deprived heat is given to the heat-exchange block 6. The coolant 7 circulates in the heat-exchange block 6 for exhausting the stage-deprived heat to external surroundings.

The liquid coolant 7 cools both dry air and the inspection stage 9.

Photodevice chips S are carried by a conveying collet 32. The collet 32 is a tool for vacuum-chucking a chip S, lifting the chip S in the vertical direction, carrying the chip S from a spot to another spot in horizontal directions and lowering the chip S in the vertical direction. A detecting photodiode 33 and a light reception ferrule 34 followed by an optical fiber 35 are provided in front of the inspection stage 9 for observing the light emitted from an object light emitting device chip S on the stage 9. The set of the photodiode 33 and the ferrule 34 with the optical fiber 35 is the measuring tools for the case of light emitting photodevice chips (LDs and LEDs).

The detecting photodiode 33 receives all the light emitted from the photodevice chip S and measures the whole power W of the emitted light including all the wavelengths. The light reception ferrule 34 guides the chip-emitting light via the optical fiber 35 to a spectrometer (not shown in the figures). The spectrometer measures wavelength-dependent partial power $P(\lambda)$ which is called spectrum. In the examination, the driving current I for supplying to the object chip S is a definite constant. Use of the detecting photodiode 33 and the spectrometer enables the present invention to inspect the total emission power W and the emission spectrum $P(\lambda)$ at the same time.

A dry-air supplying tube 18 is equipped for communicating with the inner space of the dry-air chamber 2 via a junction hole 19. In an actual assembly shown in FIG. 2, a shield casing 40 is provided for encapsulating the heat-exchange block 6, the Peltier element 8, the inspection stage 9, the coolant inlet tube 4 and the coolant outlet tube 5. The shielding casing 40 has functions of storing dry air, rectifying dry air, maintaining an inner dry cool atmosphere, preventing air from condensing and protecting the cool inspection stage 9 from wetting. Without the shielding casing 40, dry air would rapidly diffuse away and the cooled stage would be exposed to humid atmosphere having a high dew temperature. If the ordinary air with a high dew temperature were in contact with the chip and the stage, high humidity would make dew, and the inspection stage 9, chip S, and probe 60 would be wetted. Wetting of the stage, chip and probe would forbid the inspection. The present invention covers the stage, chip, probe and other parts with the shield casing 40. The shield casing 40 is indispensable to the present invention.

The shield casing 40 is shaped like a box as shown in FIGS. 2, 3 and 4. The shield casing 40 consists of a front shield plate 42, a bottom shield plate 43, a left shield plate 44, a right shield plate 45 and a top shield plate 46. The rear end is open.

The shield casing 40 is connected to the dry-air chamber 2 at the rear end.

The shield casing 40 is made from a highly heat-insulating material. Candidates of the shield casing are, for example, a thin metal box-shaping case lined with thick porous layers, a ceramic box inner-coated with bubbled plastics, an aluminum housing stuck by a heat-insulating material and a thin metal box sandwiched by heat-insulating sheets. An opaque shield casing 40 is allowable. But a transparent shield casing 40 is more convenient than an opaque one, since one can observe the inner space of a transparent shield casing.

The shield casing 40, which is excellent in heat-insulation, has a function of maintaining the low temperature in the inner space and another function of rectifying dry air into uniform flow. The constant section of the shield casing 40 favors the uniform flow of dry air. The shield casing 40 has an opening 50 at the forefront. The front opening 50 enables the collet 32 to lay a chip S upon the inspection stage 9 and to pick the chip S up from the inspection stage 9. The opening 50 allows dry air to exhaust in the forward direction. The section of the opening 50 is smaller than the section of the stream in the shield casing 40. The opening 50 enables the dry air to form a uniform stream in the shield casing 40. Small discharge holes 55 bored on the top shield plate 46 allow dry air to leak upward. The discharge holes 55 have a function of inhibiting external humid air from invading.

Photocharacteristics of device chips S should be examined at a low temperature of −40° C. Heat is transferred between both ends by supplying an electric current to the Peltier element 8. For cooling the inspection stage 9, the Peltier element 8 should carry heat from the inspection stage 9 to the heat-exchange block 6. The heat conveyed to the heat-exchange block 6 heats the liquid coolant 7 flowing via the coolant inlet tube 4 in the heat-exchange block 6. The heat is eliminated from the heat-exchange block 6. The liquid coolant 7 is warmed. The warmed liquid coolant 7 is exhausted via the coolant outlet tube 5 to a withdrawal tank (not shown) or another heat-exchanger. The coolant 7 and the Peltier element 8 cool the inspection stage down to −40° C. and maintain the inspection stage at the low temperature. A thermocouple (not shown in the figures) monitors the temperature of the inspection stage 9. When the stage temperature exceeds the prescribed range around −40° C. upward, the current of the Peltier element 8 should be increased. When the stage temperature falls below the prescribed range, the Peltier current should be decreased. Such a control enables the Peltier element 8 to maintain the inspection stage in an optimum range around −40° C.

If the inspection table were cooled at such a low temperature in the ordinary atmosphere, water vapor contained in air would be condensed into water and would dew the inspection stage 9. The chip would be also wetted. Wetting of the chip would inhibit inspection. The present invention prepares a shield casing and fills the shield casing with dry cool air Q. In the invention, dry air Q is jetted from the dry-air chamber 2 via narrow holes of the dry-air rectifying plate 3 to the inner space in the shield casing 2. The inspection stage 9 and the chip S are enclosed by the dry air having a low dew point. Cooling the dry air down to a temperature as low as −40° C. does not cause vapor condensation in the dry air. The present invention uses dry air having a dew point of, e.g., −60° C.

Dry air is prepared by repeating adiabatic compression and adiabatic expansion of air, cooling the air, lowering the dew point and eliminating water vapor from the cool air by a compressor and a heat-exchanger. Instead of making dry air from the atmospheric air by the adiabatic processes, nitrogen gas prepared by vaporizing liquid nitrogen is available for dry air. Vaporized nitrogen gas, which contains no water, is dry and cool. Vaporized nitrogen gas is superior to the dry air made by the repetitions of compression and expansion. The cost may be a problem for the use of expensive liquid nitrogen. Consumption of dry air Q, which depends upon the area of the opening 50, is small. Dry air consumption is, e.g., 3 liter/min to 10 liter/min in the present invention. When the opening 50 is a 20 mmφ round, 5 liter/min is a sufficient dry air supply. Dry nitrogen gas prepared by vaporizing liquid nitrogen costs about 0.01 dollar/liter. Use of liquid nitrogen is not costly.

As depicted in FIG. 3, the conveying collet 32 vacuum-chucks a photodevice chip S (e.g., LD chip) on a chip tray (not shown), carries the chip S via the opening 50 and lays the chip S onto the inspection stage 9. The chip S has a bottom electrode and an upper electrode. The chip S is pushed onto the inspection stage 9 by the probe 60 at the upper electrode as shown in FIG. 4. In the case of a light emitting device, an electric current is supplied to the chip S via the probe 60 and the inspection stage 9. The chip S (LD or LED) emits light. The light goes out via the opening 50. The whole power of the emission is measured by the detecting photodiode 33. The emission spectrum is measured by a spectroscope and a power meter which are connected to the optical fiber 35 and ferrule 34. After the inspection, the conveying collet 32 vacuum-chucks the chip S, lifts the chip S from the inspection stage 9 and carries the chip S to another tray (not shown). One cycle of examination is finished. A new object chip S is conveyed from the chip tray to the inspection stage 9 by the collet 32. A similar examination is done on the next chip S. Inspection of low temperature characteristics will be proceeded by Embodiment 1 of the present invention chip by chip.

As shown in FIG. 4, the chips S is pressed upon the cold inspection stage 9 by the probe 60. The chip S is cooled by the inspection stage 9. The volume of a chip S is very small. A side is 200 μm to 400 μm. The thickness is 200 μm to 400 μm. A square chip S has a volume of 0.008 mm³ to 0.064 mm³. The chip S is cooled in about one second to the predetermined low temperature (e.g., −40° C.). In the case of an LD chip, a current of a threshold current plus 20 mA ($I_{th}$+20 mA) is supplied as a driving current. When the driving current is applied, the LD chip emits light. The whole power and spectrum are measured on the instant. It takes about 30 seconds to inspect a chip including conveying time. Consumption of dry air in 30 seconds is small. The present invention gives a low-cost inspection method to photodevices.

Embodiment 2

Figure 6:
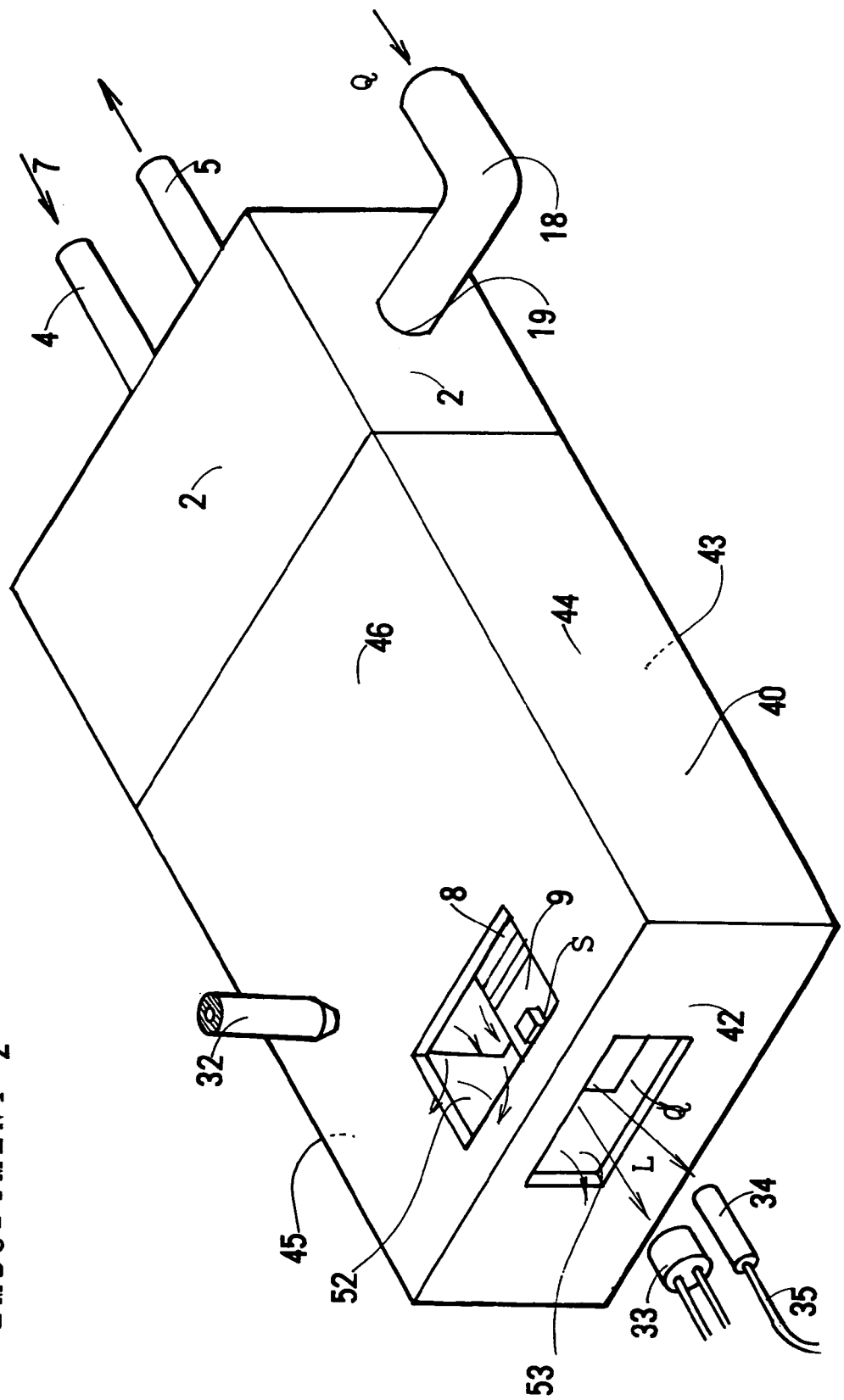
FIG. 6 is a perspective view of the whole of a temperature characteristic inspection device of Embodiment 2 of the present invention in a state of being encapsulated in another shield casing.

Two Openings; Top Opening and Fore Opening;
FIG. 6

FIG. 6 shows a perspective view of a low temperature characteristic inspection device as Embodiment 2 of the present invention. Instead of one, two openings are perforated on the shield casing. Embodiment 2 has a top opening 52 for loading chips to the stage or unloading chips from the stage and a fore opening 53 for allowing inspection light to go into or go out of the shield casing. The total area of openings is smaller than Embodiment 1. Narrower openings enable Embodiment 2 to raise the pressure of dry air in the shield casing, to alleviate dry air consumption and to give an inspection device of lower cost than Embodiment 1.

The scope of the present invention is not defined within the embodiments.

What we claim is:

1. A temperature characteristic inspection device comprising:
   an inspection stage for sustaining a light emitting device chip or a light receiving device chip;
   a cooling device for cooling the inspection stage;
   a coolant supplying/exhausting device having a coolant inlet tube for introducing a liquid coolant and a coolant outlet tube for exhausting warmed liquid coolant for cooling the cooling device;
   a shield casing encapsulating the inspection stage, the cooling device, a part of the coolant inlet tube and a part of the coolant outlet tube joining the cooling device;
   a dry-air chamber following a rear of the shield casing for introducing and accommodating dry air temporarily;
   a dry-air path produced in the shield casing;
   a dry-air rectifying plate fitted on a front of the dry-air chamber for supplying the dry-air path in the shield casing with a laminar flow of dry air from the dry-air chamber;
   an opening perforated at a front upper part of the shield casing for exhausting dry air and for allowing the chip to go in or go out therethrough;
   a collet for fetching an unexamined chip onto the inspection stage and for taking an examined chip off from the inspection stage via the opening;
   a probe for coming via the opening in contact with an electrode of the unexamined chip to supply a current or a voltage to the chip; and
   a photocharacteristic examining device for detecting light emitted from the chip or irradiating the chip with a test beam and measuring a photocurrent induced;
   wherein the dry-air path has a section having a shape and a size identical to a shape and a size of the dry-air rectifying plate, the opening has a section smaller than the section of the dry-air path, photocharacteristics of the light emitting device chips or the light receiving device chips are examined by chucking the chip by the collet, conveying the chip via the opening into the shield casing, laying the chip on the inspection stage, bringing the probe into contact with an electrode of the chip, blowing cool dry air to the chip, examining photocharacteristics of the chip, chucking the chip by the collet and taking the chip off by the collet from the inspection stage via the opening.

2. The temperature characteristic inspection device as claimed in claim 1, wherein the inspecting stage for sustaining a light emitting device chip or a light receiving device chip is positioned in a downstream of the dry air path beginning from the dry-air rectifying plate and being formed in the shield casing, the inspection stage is positioned close to the opening, the dry-air path has a section having a shape and a size identical to a shape and a size of the dry-air rectifying plate, the opening has a section smaller than the section of the dry-air path, photocharacteristics of the light emitting device chips or the light receiving device chips are examined by chucking the chip by the collet, conveying the chip via the opening into the shield casing, laying the chip on the inspection stage, bringing the probe into contact with an electrode of the chip, blowing cool dry air to the chip, examining photocharacteristics of the chip, chucking the chip by the collet and taking the chip off by the collet from the inspection stage via the opening.

3. The temperature characteristic inspection device as claimed in claim 1, wherein the coolant inlet tube and the coolant outlet tube pierce the dry-air chamber, and the dry air is cooled by exchanging heat between the coolant and dry air in the dry-air chamber.

4. The temperature characteristic inspection device as claimed in claim 1, wherein the dry-air rectifying plate capable of supplying dry air into the dry-air path in the shield casing is a porous plate.

5. The temperature characteristic inspection device as claimed in claim 1, wherein a velocity of the dry air in the dry-air path in the shield casing is less than 0.5 m/sec.

6. The temperature characteristic inspection device as claimed in claim 1, wherein the cooling device for cooling the inspection stage is a Peltier element and a heat-exchange block, the heat-exchange block is cooled by the coolant, and the Peltier element is sandwiched between a side of the heat-exchange block and a side of the inspection stage.

7. The temperature characteristic inspection device as claimed in claim 6, wherein the coolant inlet tube of supplying the coolant for eliminating heat produced in the Peltier element and the coolant outlet tube for exhausting the coolant penetrate the dry-air chamber and extend to the heat-exchange block.

8. The temperature characteristic inspection device as claimed in claim 1, wherein the shield casing for separating dry air from external air is lined with a porous material for heat-insulation.

9. The temperature characteristic inspection device as claimed in claim 1, wherein discharge holes are perforated at a top of the shield casing in a direction vertical to the dry-air path for discharging dry air.

10. The temperature characteristic inspection device as claimed in claim 1, wherein the opening is separated into a top opening for conveying a chip into or out of the shield casing and a front opening for allowing light to pass.

11. The temperature characteristic inspection device as claimed in claim 10, wherein the opening is separated into a top opening for conveying a chip into or out of the shield casing and a front opening for allowing light to pass, and the shield casing is furnished with a sliding cover for covering the top opening at the inspection and for discovering the top opening at the chip exchange.

* * * * *